US007064690B2

(12) United States Patent
Fowler et al.

(10) Patent No.: US 7,064,690 B2

(45) Date of Patent: Jun. 20, 2006

(54) SENDING AND/OR RECEIVING SERIAL DATA WITH BIT TIMING AND PARALLEL DATA CONVERSION

(75) Inventors: Michael L. Fowler, Saco, ME (US); James B. Boomer, Falmouth, ME (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 10/824,747

(22) Filed: Apr. 15, 2004

(65) Prior Publication Data

US 2005/0231399 A1 Oct. 20, 2005

(51) Int. Cl.
*H03M 9/00* (2006.01)

(52) U.S. Cl. ...................................... 341/101; 341/100

(58) Field of Classification Search ................. 341/50, 341/101, 100, 141, 161; 375/354; 713/400, 713/500

See application file for complete search history.

(56) References Cited

U.S. PATENT DOCUMENTS

| | | | | |
|---|---|---|---|---|
| 4,556,850 | A | 12/1985 | McBrien | |
| 4,680,733 | A | 7/1987 | Duforestel et al. | |
| 4,689,740 | A | 8/1987 | Moelands et al. | |
| 4,841,549 | A | 6/1989 | Knapp | |
| 5,138,634 | A | 8/1992 | Knapp | |
| 5,559,502 | A | 9/1996 | Schutte | |
| 5,668,830 | A * | 9/1997 | Georgiou et al. | 375/220 |
| 5,907,566 | A | 5/1999 | Benson et al. | |
| 6,031,473 | A | 2/2000 | Kubinec | |
| 6,369,501 | B1 | 4/2002 | Aoki et al. | |
| 6,396,888 | B1 | 5/2002 | Notani et al. | |
| 6,397,042 | B1 | 5/2002 | Prentice et al. | |

(Continued)

FOREIGN PATENT DOCUMENTS

| | | |
|---|---|---|
| JP | 60107938 | 6/1985 |

(Continued)

OTHER PUBLICATIONS

Michael L. Fowler et al., Bit Clock With Embedded Word Clock Boundary, Mar. 16, 2004.*

Michael L. Fowleret al, Architecture For Bidirectional Serializer and De-Serializer, Mar. 16, 2004.*

International Search Report dated May 18, 2005 for Related Application No. PCT/US2005/007944.

(Continued)

*Primary Examiner*—John B Nguyen

(74) *Attorney, Agent, or Firm*—Cesari and McKenna LLP; Edwin H. Paul, Esq.

(57) ABSTRACT

A serializer and a deserializer are disclosed and shown operating singly or as a pair. The invention operates independently from any outside system reference clock. The inventive system provides an internal bit clock that serializes the data when sending and de-serializes the data when receiving. A bit clock or pulse travels with the data word bits to define when a bit is stable. The system uses word boundary bits operating with a bit clock to distinguish different data words, as described in the parent application. The system operates either synchronously or asynchronously with the base computer or other such digital system, including I/O devices. The invention finds use where new data to be sent is strobed into the serializer, but also where a change in the data bit content itself will cause the changed data to be loaded into the serializer and sent bit by bit. The system operates where new data is strobed or loaded by the serializer (not the base computer system) when the last data word has been sent. In this case a signal is generated when the last word has been sent in the serializer that causes new data to be loaded for sending. Half duplex and full duplex configurations as disclosed. Similar, corresponding operations occur at the deserializer.

43 Claims, 11 Drawing Sheets

U.S. PATENT DOCUMENTS

| | | | | |
|---|---|---|---|---|
| 6,496,540 | B1 * | 12/2002 | Widmer | 375/242 |
| 6,516,952 | B1 | 2/2003 | Wang et al. | |
| 6,542,096 | B1 | 4/2003 | Chan et al. | |
| 6,593,863 | B1 * | 7/2003 | Pitio | 341/101 |
| 6,653,957 | B1 | 11/2003 | Patterson et al. | |
| 6,693,918 | B1 | 2/2004 | Dallabetta et al. | |
| 6,880,056 | B1 * | 4/2005 | Kootstra | 711/168 |
| 6,892,337 | B1 * | 5/2005 | Brophy et al. | 714/739 |
| 2001/0053188 | A1 | 12/2001 | Kumata | |
| 2003/0088725 | A1 * | 5/2003 | VanKrevelen | 710/305 |
| 2004/0236977 | A1 * | 11/2004 | Kizer et al. | 713/500 |

FOREIGN PATENT DOCUMENTS

| | | |
|---|---|---|
| JP | 02260734 | 10/1990 |

OTHER PUBLICATIONS

International Search Report dated May 18, 2005 for Related Application No. PCT/US2005/007945.

Notification of Transmittal of the International Search Report and the Written Opinion of the International Search Authority, or the Declaration, PCT/US2005/009311, mailed Dec. 6, 2005.

* cited by examiner

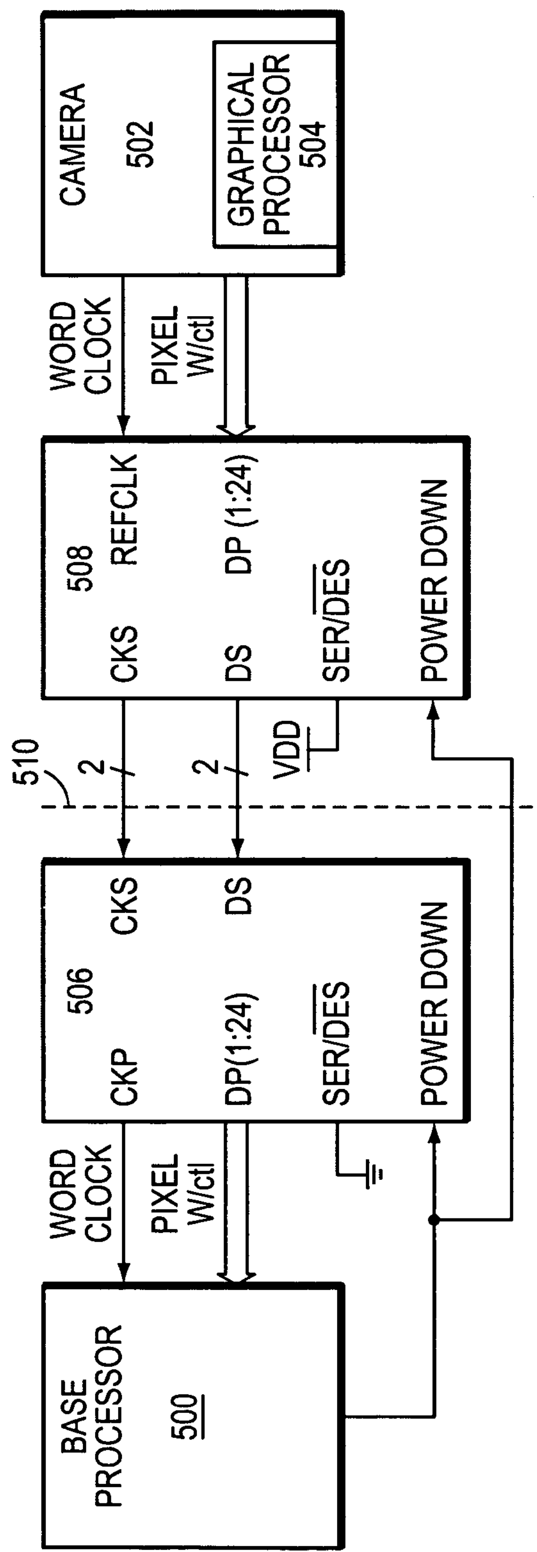
FIG. 19
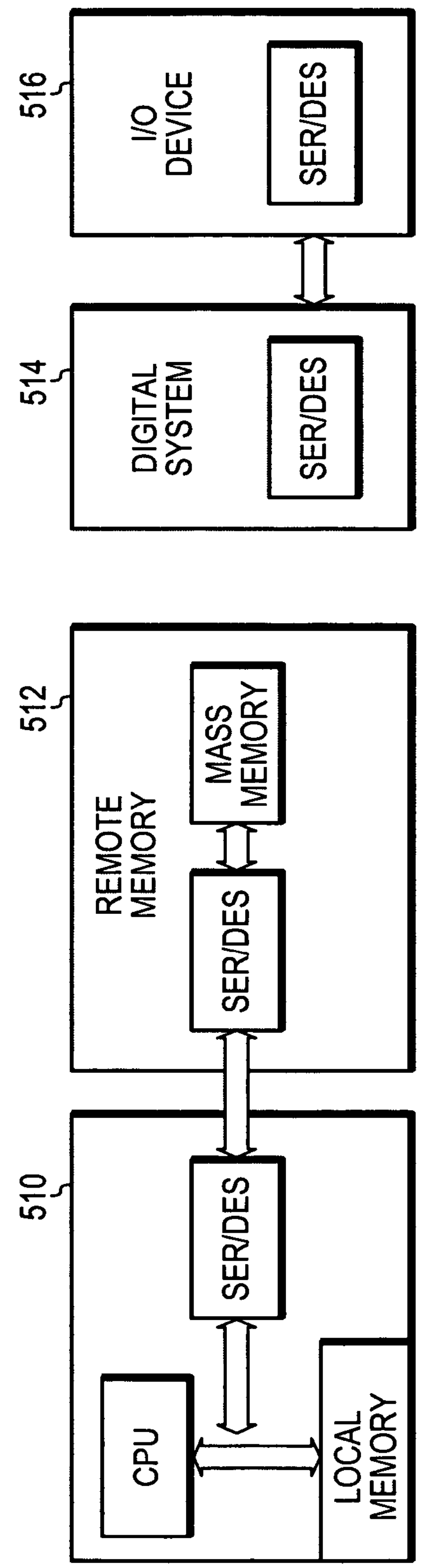
FIG. 21
FIG. 20

SENDING AND/OR RECEIVING SERIAL DATA WITH BIT TIMING AND PARALLEL DATA CONVERSION

CROSS REFERENCE TO RELATED APPLICATIONS

The present invention is related to an allowed application entitled, "BIT CLOCK WITH EMBEDDED WORD CLOCK BOUNDAR," Ser. No. 10/802,436 filed on Mar. 16, 2004, and to an application entitled, "ARCHITECTURE FOR BIDIRECTIONAL SERIALIZERS AND DESERIALIZER," Ser. No. 10/802,372 filed on Mar. 16, 2004. Both of these applications are owned by the same entity, and are both incorporated herein by reference.

BACKGROUND OF THE INVENTION

1. Field of the Invention

The present invention relates to data transmission, and more particularly to serializing and sending, bit by bit, data where the data word boundary is determined in order to properly receive and de-serialize the data.

2. Background Information

FIG. 1 illustrates a known serializer in a block schematic form. A parallel data word 10 is loaded into a buffer register 12 with a word clock 14. The word clock 14 is also fed to a phase locked loop (PLL) or a delay locked loop (DLL) 16, hereinafter PLL will be used to refer to both the PLL and DLL. The PLL generates a bit clock 18 that loads the shift register 20 and subsequently shifts out the data in the shift register 20 serially bit by bit through a cable or transmission line driver 22. The bit clock 18 that shifts the data out bit by bit stays synchronized to the bit positions within the word by the PLL. Along with the serial bits from driver 22 a word clock 24 is output via driver 26. The receiver will be able to distinguish the beginning and ending of the serial data stream by referencing the bit stream via the word clock.

FIG. 2 shows a receiver circuit that de-serializes the bits to form words. The serial data 30 is input to a shift register 32. The word clock 34 is input to a PLL 36 that generates a bit clock 38 that is synchronized to the bit location in a word by the PLL. With this synchronization, the bit clock 38 properly loads the bit stream into the shift register 32. When the word has been received by the shift register 32 (as determined from the word clock), the PLL outputs a clock 40 that loads the parallel data in the shift register 32 into a buffer register 42. The word data 44 is in parallel form ready for use in the receiving system.

FIGS. 1 and 2 contain a buffer register that holds the word to be sent or the word just received. The buffer allows nearly the entire time for a word to be sent or received before the next word is loaded. The logic and the timing to accomplish these tasks are well known. However, the buffer registers are not required, and if not used then the word to be sent and the word received must be loaded during a bit time. Again such designs are well known in the art.

FIG. 3 shows a complete bidirectional system using the serializers as in FIG. 1 and deserializers as in FIG. 2. Note that there are eight data lines and a single clock into each serializer and out from each deserializer. The data and clock lines between the serializer and the deserializer are typically differential signals each using two conductors.

The serializer/deserializer of FIG. 3 each contain a PLL that are common in such devices, but PLL's consume significant power, are complex, require long locking times, and occupy considerable chip real estate. It would be advantageous to dispense with PLL's.

FIG. 4 is a timing diagram that shows a generic timing chart that illustrates the serial sending of a framed ten bit word. A word clock 60 is fed to a PLL that generates a synchronous bit clock 62, the word clock 60 must occur often enough for the PLL to remain locked. The data bits are loaded into a shift register using a word clock edge. Then the data bits in the shift register are shifted out serially by the bit clock 62. In FIG. 4 a eight bit word is shifted out on the rising edge of the bit clock 62.

A similar operation applies to the receiving of the serial data. In this case, the word clock is received and applied to a PLL that generates a synchronous (to the word clock) bit clock that is used to load the data bits into a receiving shift register. Data bits must be stable when the clocks cause the data bits to be sent and to be received. Time delays are designed into such systems to accomplish this, as known in the art. In the case shown, the data bits are sent out synchronously where the lowest order bit of the next word is sent out directly after the most significant bit of the prior word. In other instances the data may be sent out asynchronously, typically using a start and stop bit that frames the data bits. In both the synchronous and asynchronous cases, system means must be employed, as are well known in the art, to prepare the sender and the receiver to properly send and receive the data. Also, systems are arranged to send data alternately then to receive data; while other systems can send and receive simultaneously. The former is referred to as half duplex and the latter as duplex. Again, system designers understand the limitations and requirements of such systems to properly send and receive data.

It is axiomatic that the receiving system must be able to distinguish data word boundaries from a stream of serial bits, as discussed above.

The prior art designs use PLL to provide synchronous bit clocks at both the sending and the receiving systems. However, PLL's occupy significant real estate on a die and consume considerable power and time before being locked.

In general, transferring serial data offers an advantage in that the cable running between the sending and receiving systems need only have a few signals (if differential signals, one data pair and one clock pair) carrying wires (and, of course, if single ended a return wire or wires). In contrast, sending data over cables in parallel requires line drivers for each bit in a word and a clock driver. These parallel drivers consume high power and output high currents that create significant system noise.

In applications where cables or transmission lines are not used, but where parallel data is sent between integrated circuit packages, many pins on those packages must be set aside for each bit of the parallel data. In the newer designs, using sixty-four and one hundred and twenty-eight bits, the pins available on the packages become a design limitation. Larger packages, ball grid arrays, and similar packages that provide pins over the entire bottom surface of a package address this problem. However, the problem persists. Applications that may suffer from these limitations include virtually all computing systems with complex displays, e.g. cell phones, desk-top and lap top computers, electronic games, computing systems with off-chip memory, any computing system addressing bulk memory, and electronic instrumentation, monitoring and controlling equipment.

FIGS. 5 and 6 are illustrations of buffer circuits that may use logic level translators between the various different voltages used by different logic families, for example, TTL, low level TTL, CMOS, and current mode logic families.

FIG. 5 shows bidirectional buffers 70 that drive the A(0–7) signals to the B(0–7) signals when the AtoB signal is high. The signals travel the opposite direction when the BtoA signal is high. A single bidirectional buffer circuit is shown in 70 and, in this instance of eight bits, the parallel buffers for the other seven bits are indicated by 70.' Prior art replacement of these buffer style circuits with serializers suffers from the power dissipation and complexity of the PLL's, the need for a reference clock, the lock time of the PLL, and the chip real estate occupied. In FIGS. 5 and 6 as shown, the AtoB and BtoA signals are low true. The DIR and EN-signals control the direction. In this case, the EN- must be low to allow the DIR signal to determine the data flow direction. If EN- is high, both the BtoA and AtoB are high and the A and B signals are isolated from each other.

FIG. 6 shows a buffer-type circuit where the eight data bits A(0–7) are clocked into the D-type flops, one bit shown as 80. The CK AtoB would load A0 into the flop 81. The A0 data is output as Q flop signal and then to the B0 line when AtoB is high. Similar action occurs from sending B0 to the A0 line when BtoA is high. The circuitry for the other seven bits is indicated by 80.'

It would be advantageous to use a serializer to replace the buffers of FIGS. 5 and 6 without the disadvantages of using a PLL.

Up to the present time, serializing and de-serializing data entails using PLL's that are complex and costly of power chip space and time, as discussed above. However, serializing and de-serializing would find greater acceptance if these limitations were removed.

SUMMARY OF THE INVENTION

In view of the foregoing background discussion of the prior art, the present invention provides advantages in serializer/deserializer and a method for sending and receiving serial data without using phase of delay locked loops. The serializer/deserializer sends out a data word bit by bit and receives a data word bit by bit. In preferred applications, the data word bits are sent out with word boundary of framing bits and sometimes with filler bits. The boundary bits help distinguished different data words.

A register for holding the data word is loaded from a parallel computer bus and the output of the register is connected to a serial output data port for sending the data bits out over, preferably, a matched transmission line. In a preferred embodiment, a free running pulse generation or clock, that is not locked to any reference signal, is connected to a control input on the register after a data word has been loaded into the register. Herein, the word pulse generator and clock are used synonymously as will be understood by those practitioners in the art. The stored word data bits and boundary bits are serially output in response to the clock. The pulse generator signals are also sent out in parallel with the serial data bits. The receiver will use these signals to load in the bits as they arrive.

In another preferred embodiment, a gated clock is employed. In this case the signal that loads the data word to be sent is used to start a pulse generator that sends or shifts out the data word and, as before, any boundary or framing bits.

In yet another preferred embodiment, using either the free running or the gated pulse generator, a change in the data word content, at least one bit changes state, is detected and initiates that changed word being sent out serially with a bit defining pulse signal. Either the free running or the gated pulse arrangement may be used with this embodiment.

The deserializer includes a serial port for receiving a data word bit by bit into a second register for storing the bits. The second register has a data input and a control input. There is a clock signal received with the received serial data bits that defines the received second data word bits. This is used to clock the data into the second register.

In a preferred embodiment, a bi-directional data line and a bi-directional clock line are provided that are buffered from the serializer/deserializer electronics so that the data and clock signal flow directions may be reversed. In a preferred embodiment, a parallel data word is loaded into a shift register by a word or load signal. This might be an addressed write (a load signal) from a computer system parallel bus. A clock shifts the data out over the data line. This shift clock is synchronized with the word clock so that the data is properly loaded before shifting occurs. The shift clock is modified before or after being sent out over the bi-directional clock line coincident and synchronized with the data bits being sent.

In a preferred embodiment, the clock traveling with the data is delayed before or after sending, so that a clock edge or other such signal is present to indicate when a data bit is stable.

In another preferred embodiment, a word load signal, sometimes referred to as a word clock, latches data into buffer registers. Between a serializer and a deserializer, the data lines are bidirectional as is the bit clock line. There is an overall master or controller that handles the data and clock direction reversals so that information is not lost.

In another preferred embodiment, the sender and the receiver turn around the data/clock signal directions in response to control/status line or lines between the two. Protocols may be developed by those skilled in the art to ensure that proper control of the communications between the sending and receiving systems. For example, a busy signal may be used where if busy was not asserted, the system wanting control would assert busy. At some random time, the system would dis-assert busy in case the prospective receiver asserted busy at the identical time. If the busy signal remained asserted, that side would delay taking control until the other side finished and dis-asserted busy. If the busy signal went dis-asserted, that side would re-assert the busy and send its message. Information being transferred would typically have an error check system, so that if there was contention remaining on the communication, improper information would be detected and the transfer re-tried at some later time. Such techniques and systems are well known in the art.

In another preferred embodiment, the sending system may continuously output data words without any handshake. The system and the receiver must be arranged to receive the words in a timely fashion.

The present invention also provides means for incorporating word boundaries into and determining data word boundaries from a stream of data bits. More information may be found in the related applications referenced above. One or two boundary data bits are typically added to the data bits of each word. The boundary bit or bits may be located within the word data bits or after or before the word data bits.

When two boundary bits are used, they are arranged so that a logic level transition must occur between the two boundary data bits. The transition may be either high to low or low to high. A bit clock accompanies the serial data bits to determine when each bit is stable and suitable for. However, the bit clock is arranged with no logic level transitions during the word boundary bits. The receiving system detects a word boundary logically by sensing a data bit transition when the bit clock exhibits no transition.

When one boundary bit is used, in a preferred embodiment, the boundary data bit exhibits a double frequency, and, if the bit clock is maintained at a constant logic level during the double frequency, a word boundary is detected.

In other preferred embodiments, the data line is bidirectional but there are two unidirectional clock lines. In yet other preferred embodiments, both the data lines and the clock lines are unidirectional. This embodiment is needed when high speed data is sent over longer distances.

It will be appreciated by those skilled in the art that although the following Detailed Description will proceed with reference being made to illustrative embodiments, the drawings, and methods of use, the present invention is not intended to be limited to these embodiments and methods of use. Rather, the present invention is of broad scope and is intended to be defined as only set forth in the accompanying claims.

BRIEF DESCRIPTION OF THE DRAWINGS

The invention description below refers to the accompanying drawings, of which:

FIGS. 19, 20, and 21 are system block diagrams using the present invention.

DETAILED DESCRIPTION OF AN ILLUSTRATIVE EMBODIMENT

Figure 7:
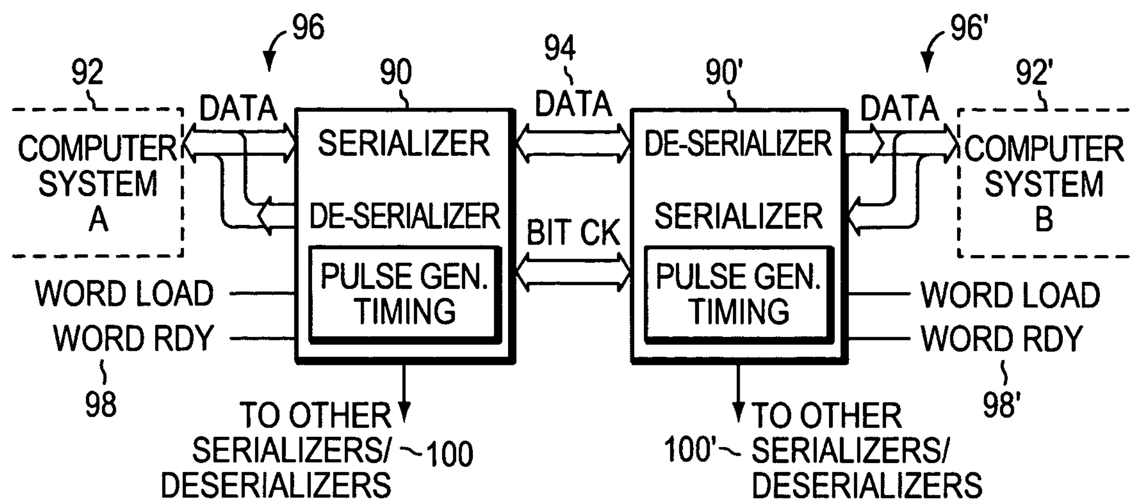
FIG. 7 is a generalized block diagram incorporating the present invention.

FIG. 7 is a generalized system block diagram embodying the present invention. As described below, many variations of FIG. 7 will be described. These implementations represent some of the configurations and operations where the present invention will be advantageous. But, the following descriptions are not exhaustive, as those practitioners in the art will know of or develop other configurations using the present invention.

FIG. 7 shows a computer system 92 that may be virtually any electronic system where parallel data is available for reading or writing, that is, besides usual computer systems, camera electronics, memory electronics, keyboards, scanners, print heads, wireless communications, etc. among other such systems known in the art that may employ the present invention.

It is helpful in describing preferred embodiments, to distinguish "synchronous" implementations where data is being sent continuously at a regular rate without using any handshaking. Data would be sent regardless of any indication that the system was ready for new data or not. An asynchronous implementation would employ handshaking signals, e.g. ready for new data and data is ready for reading, before sending new data. These terms are well known in the art. The following system descriptions incorporate some synchronous and some asynchronous system arrangements.

The computer system interfaces with a serializer/deserializer 90 via a parallel data port or contacts. The serializer 90 serializes the parallel data and sends it to the deserializer/serializer 90,' where that data is de-serialized and read in parallel by the computer system 92.' Data is transferred from computer system 92' to 92 in a similar fashion. In one arrangement there is only a serializer in 90 and only a deserializer in 90.' In this case the data transfer is one way, or simplex. Similarly, the system may be configured in the opposite direction with only a deserializer in 90 and a serializer in 90.' However, in most applications there will be both a serializer and a deserializer, as shown, in both systems 90 and 90.'

The parallel interfaces 96 and 96' have parallel data usually arranged in a bidirectional bus with buffers enabled depending on the direction of the data. The parallel interface also shows two generic control lines, WORD LOAD and RDY. As shown, these lines do not have a direction symbol since they may originate in either the computer systems or the serializer/deserializer. In one arrangement, the computer system 92, when RDY is true, will load the next word into the serializer/deserializer with the WORD LOAD signal. However, in another arrangement, the serializer may, after sending out a data word, assert the WORD LOAD signal to strobe in a new parallel word from the computing system 92. The computing system would then use the WORD LOAD to bring up the next word to be serialized.

When the computer system 92 or 92' is receiving a parallel data word from the deserializer, the RDY line can be used as an indication that the data word is available over the data lines 96. However, in another arrangement, the RDY signal may be used to strobe the data into the computer system. For example, if the data were going directly into a memory system, the RDY signal may strobe in the data word and also increment an address counter to have the memory pointing to the next location. In the following descriptions, the RDY and the WORD LOAD signal may be described with other acronyms that are easily understood to be functionally equivalent.

The pulse generation and timing blocks of 90 and 90' may incorporate a number of different clock or pulse generation circuits known in the art. For example a free running clock that is synchronized with the loading of a new word, either by an external or an internal WORD LOAD signal may be used. However, in another embodiment, a gate pulse generation circuit that is started by the WORD LOAD signal and ends when the data word and any boundary or framing bits have been sent.

As discussed below, the clock circuitry itself may be via an inverter chain, some form of delay circuit, a crystal or a tank circuit (even an RLC type circuit with an inductive or equivalent component may be used).

In yet another arrangement, the serializer/deserializers 90 and 90'output the pulse generation/timing signal 100 and 100.' These pulse signals may be distributed to other serializer/deserializers to provide a clock for such systems. In one example, a free running pulse source that is started when powered up may be distributed for sending and receiving data via other serializers/deserializers.

In addition to the many physical and functional arrangements or forms of the serializer/deserializer, pulse signals from a deserializer, say in item 90, may be sent to the sending serializer in 90' over the transmission cable 94. Then, the serializer in item 90', acting as a slave, uses the received pulse signals to serialize and send the data back to the deserializer.

Of note in FIG. 7, there is no phase or delayed locking circuitry in the serializer/deserializers 90 and 90.' Furthermore, there is no reference of other clock or timing signal fed into the serialzer/de-serializers for providing a locking reference. The serializer/deserializers have, instead, a pulse generator that is synchronized and/or gated to the sending and receiving of a data word. The inventive operation shown in FIG. 7 employs the pulse generation as discussed herein, but also provides a bit clock traveling with the serialized data between the two systems 90 and 90.' This bit clock typically will have an edge that is delayed (either at the sender or the receiver) from the data edge so that the bit clock defines the stable portion of a data bit. Alternatively, as is known in the art, the receiver may provide the delay so as to load the bits error free.

The formatting of the data and the bit clocks in preferred embodiments of the present invention are well discussed in the related applications referenced above. These related disclosures detail implementations for protocols for generating and detecting word boundaries using the bit clock and additional boundary bits (or bit) in the data field.

In operation, there may be many other variations of the operation and uses of the general block diagram of FIG. 7, and the present invention can be used to advantage in these many applications. Inventive implementations include the following independent arrangements: a) one direction serializer; b) one direction deserializer; c) bidirection data lines; d) bidirection bit clock lines; e) unidirectional bit clock lines; f) unidirectional data lines; g) handshaking; h) no handshaking; i) external word load generation; j) internal word load generation; k) free running synchronized pulse generation; l) gated pulse generation; m) starting the serializing by a word load signal; and n) starting the serializing by a change in the data. The description of these implementations as "independent" refers to the ability of those skilled in the art to employ virtually any of the enumerated arrangements without respect to the other arrangements, excepting, of course, where the arrangements are mutually exclusive (e.g. using handshaking or not).

The following text describes particular, but non-exhaustive, preferred embodiments of the present invention. They are embodiments of the general system described above.

Figure 8A:
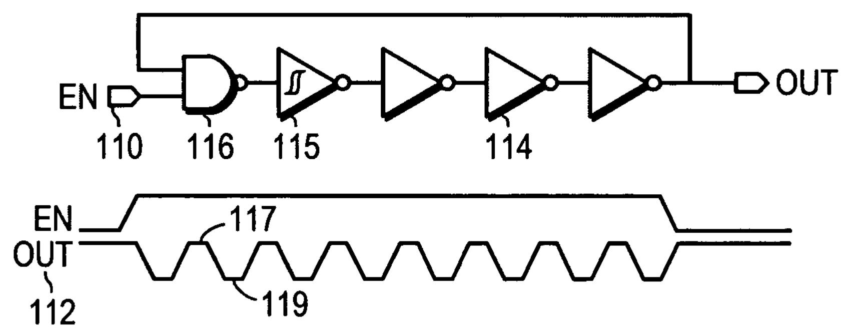
FIGS. 8A and 8B are block diagram schematics of two clocking schemes used with preferred embodiments of the invention.
Figure 8B:
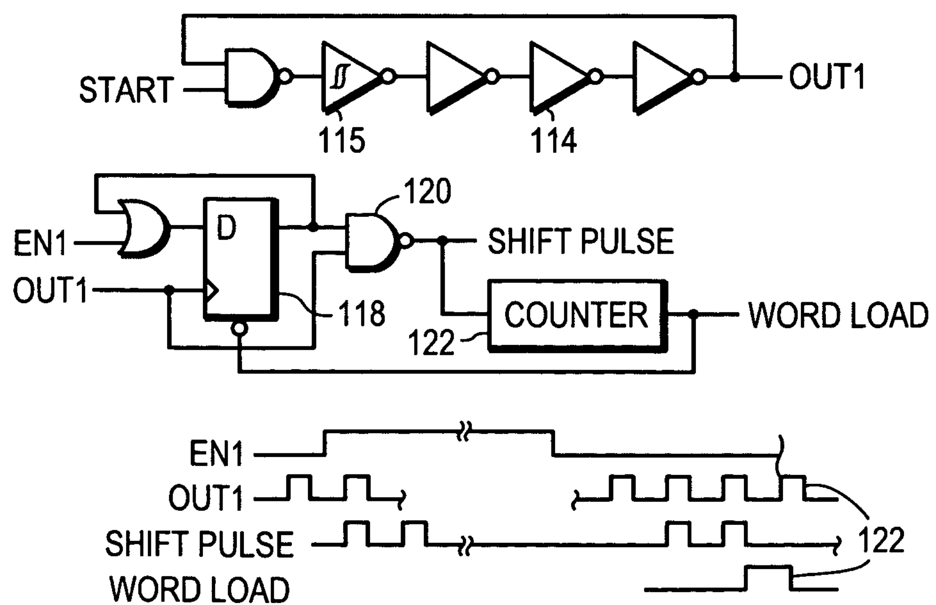

In FIG. 7, the items 90 and 90' include pulse generation/timing blocks. FIGS. 8A and 8B describe two preferred embodiments. FIG. 8A shows a gated ring oscillator. Here, when the EN signal 110 is true, the oscillator will output a series of pulses OUT 112 whose timing depends on the delay time around the loop of inverters 114 and the NAND 116. The hysteresis of the Schmitt trigger inverter 115, although not necessary, helps to ensure proper oscillation at the designed frequency. The enable pulse occurs concurrently when a data word has been input from a computing system or from receiving a deserializer full data word.

As is known in the art, pulse generators will typically be compensated for voltage, temperature and pressure.

FIG. 8B shows a free running oscillator with a START signal that is generated at power up. In this embodiment, the OUT1 pulse signal is always present after being powered. The Schmitt trigger 115 is present as are the inverters 114 that provide a delay, but other delay circuits may be used. When a word has been loaded or received from a computing system for serializing, the EN1 signal goes true. The flop 118 is set by an OUT1 pulse, and the next OUT1 pulse is sent via the NAND 120 as the shift pulse to output the serialized data. A counter 122 may be used to count shift pulses so that when a full word and any boundary bits are output, the flop 118 is reset, and in addition the WORD load signal may go back to the computing system to set up the next word to be sent. The counter may be reset (not shown) by when the WORD LOAD signal is true and the next OUT1 pulse 122. However, other ways to reset the counter may be used depending on system restrictions to ensure no lost or garbled data.

In either clock or pulse circuit of FIGS. 8A and 8B, if there were a five nanosecond (nsec) net delay through a total of five inverters, including the Schmitt and the NAND, the time of each high 117 and each low 119 would be five nanoseconds and there would be a period of ten nanoseconds and a frequency of 100 MHz. More typically, each stage delay would be sub-nanosecond. As mentioned above, many other designs will known in the art that may be used to generate a bit clock.

FIG. 8B illustrates a circuit that synchronizes the bit clock pulses to the signal that loads a new word for sending, noting that this signal may originate within the serializer/deserializer or the computing system. The START signal is a signal, for example from power up, that starts the ring pulse generator running. In this case, compared to that in FIG. 8A, the ring pulse generator is free running. When a new word is ready for sending, EN1 goes true and the flop 118 is set on the succeeding OUT1 signal. Then, the OUT1 signal is output via NAND 120 to shift out the data bits. The pulses are also counted so that when the full data word and any boundary bits have been sent, the flop 118 is reset. The counter 122 output may also be used to load in the next word ready to be sent.

Figure 1:
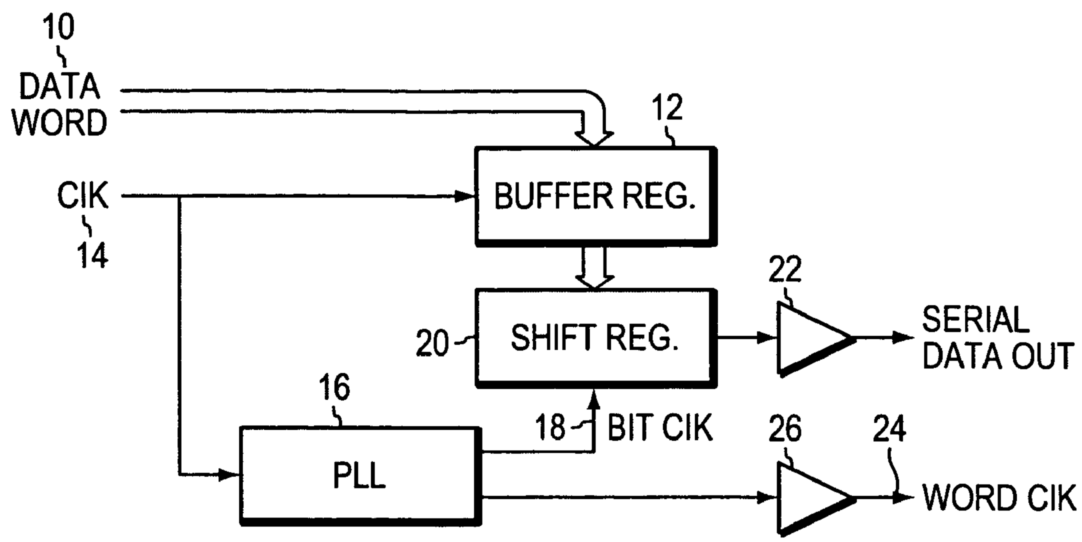
FIGS. 1 and 2 are block diagram schematics of a prior art serializer and deserializer.
Figure 2:
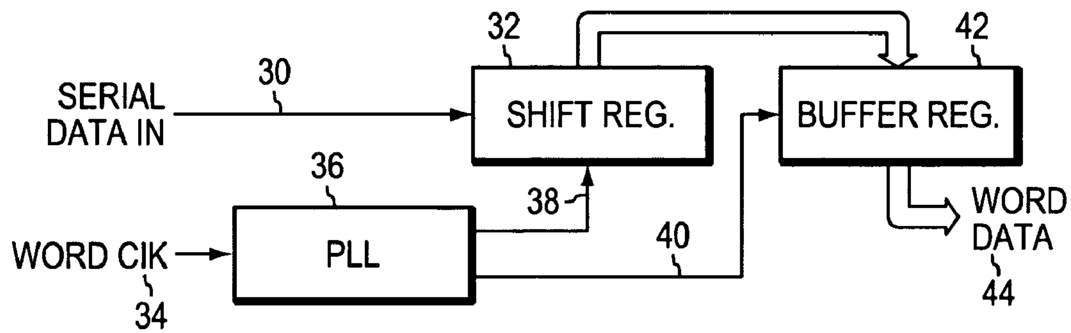
Figure 3:
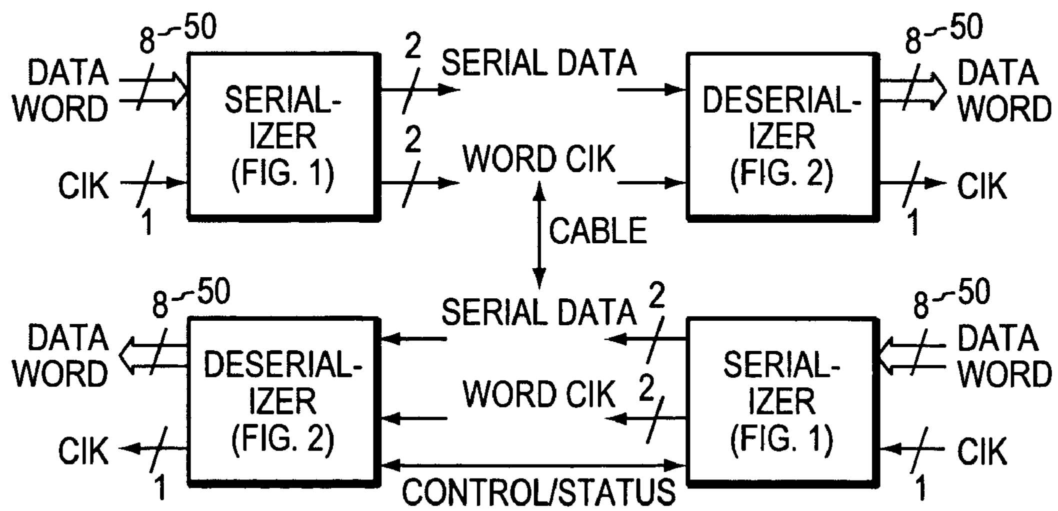
FIG. 3 is a system block diagram of a prior art duplex system.
Figure 4:
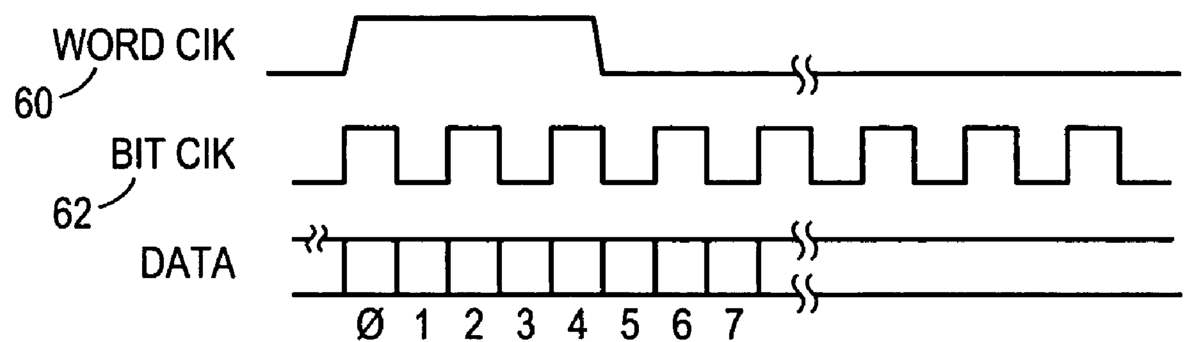
FIG. 4 is a representative prior art timing chart.
Figure 5:
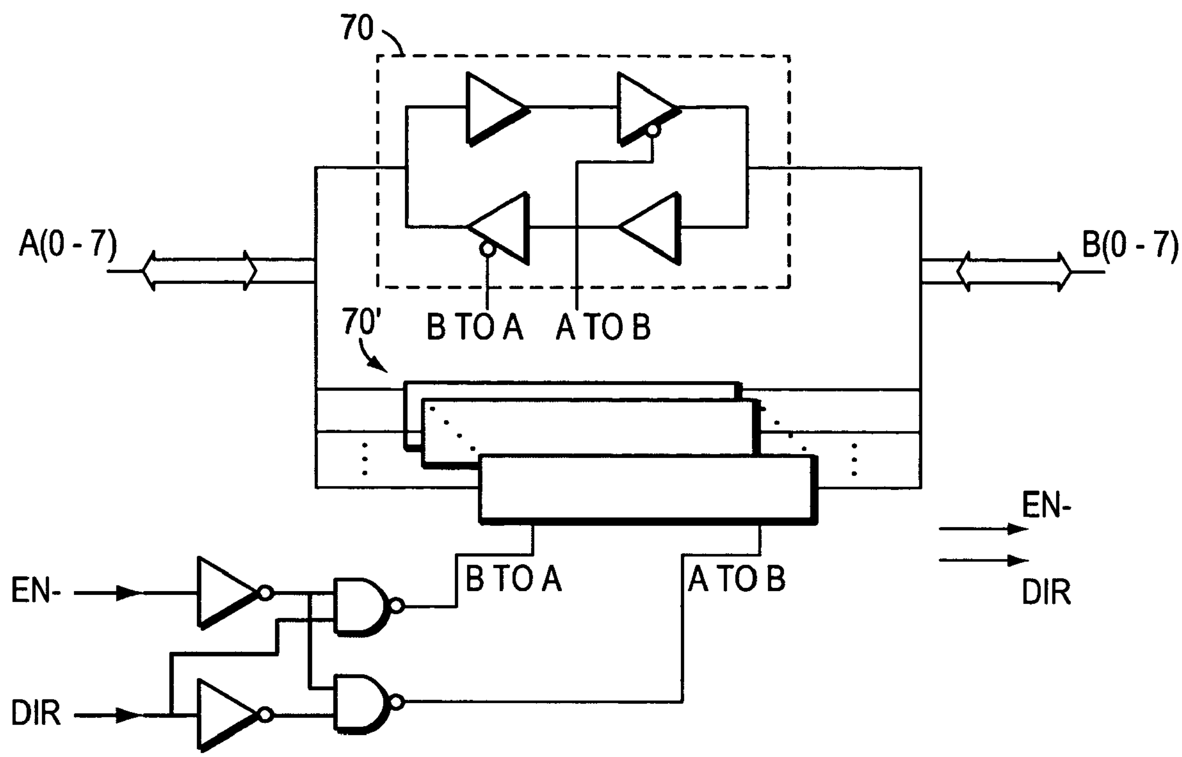
FIG. 5 is a block diagram schematic of a prior art directional buffer.
Figure 9:
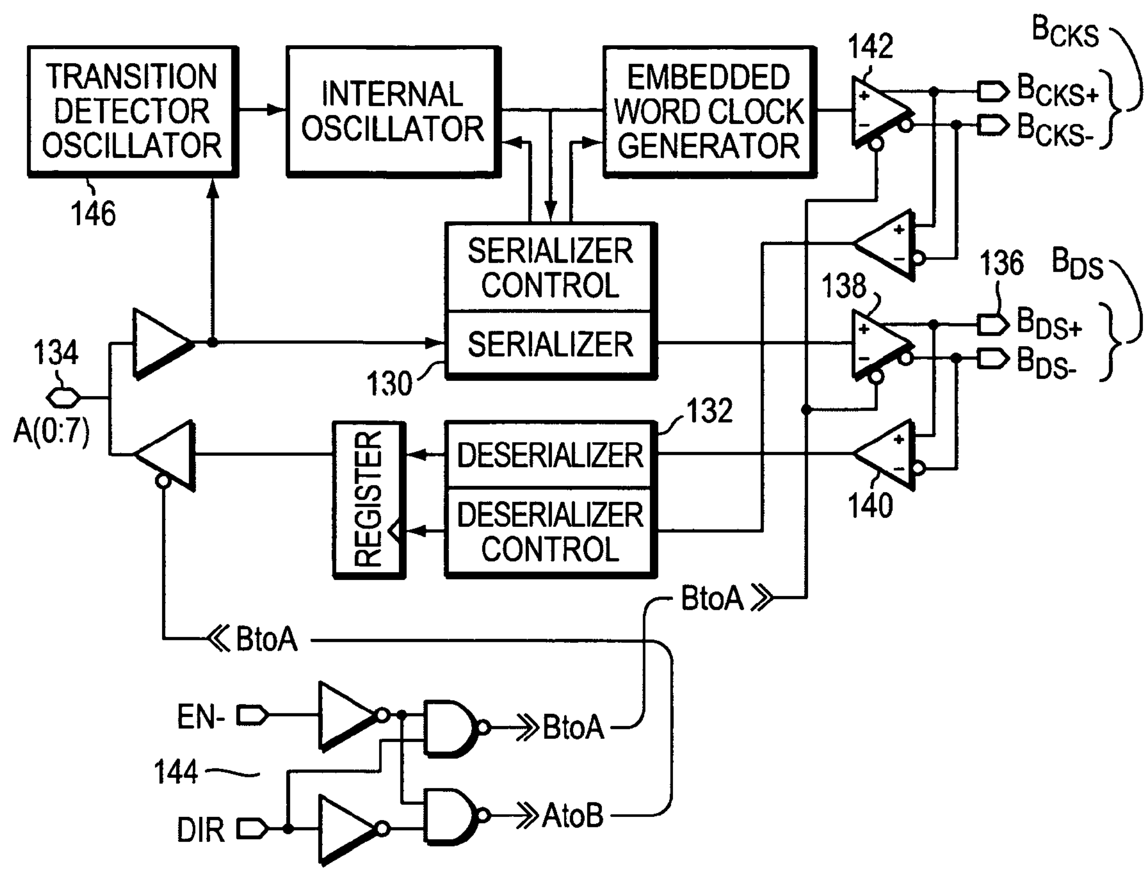
FIGS. 9 and 10 are block diagram schematics showing two preferred versions of the present invention.

FIG. 9 shows one preferred embodiment of the invention. Here, a serializer/deserializer 130/132 transfer data between the parallel A[0:7] 134 lines and the differential serial signal lines BDS+ and BDS− (BDS) 136. The parallel data on the data lines 134 are input to the serializer 130 that are then shifted out via the output buffer 138. A clock signal is output via the buffer 142 to accompany and define the serial data. The data lines BDS are bidirectional and data is received over these same lines via the input buffers 140. There is a received clock or pulse signal via the bidirectional clock BCK+/BCK− (BCKS) lines. The received data is input to a deserializer using the received BCKS signals and assembled as a parallel data word in a register. The data is placed on the data lines 134 when to be read by the computing system. The direction of the data and the clock buffers are determined by the direction circuit 144. When EN- is true (low) the DIR drives either BtoA or AtoB signals true thereby determining the data flow. This particular implementation of the present invention replaces the translator circuit shown in FIG. 5, the new circuit uses an edge detection mechanism 141 that accepts any transition of a data edge as a signal to transfer the data out. If no data edge occurs or is available, the sending system would provide a strobe of load signal to initiate the transfer, for example, from an enable signal. Such signals are known in the art.

Figure 6:
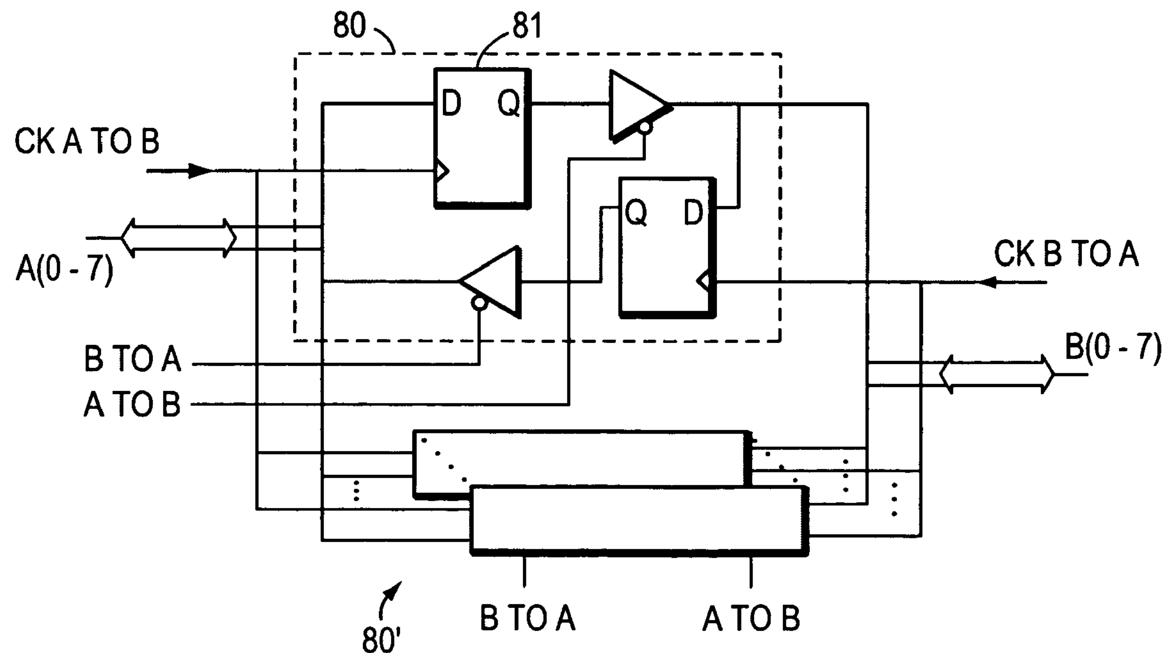
FIG. 6 is a block diagram schematic of a prior art directional buffer incorporating a storage register.
Figure 10:
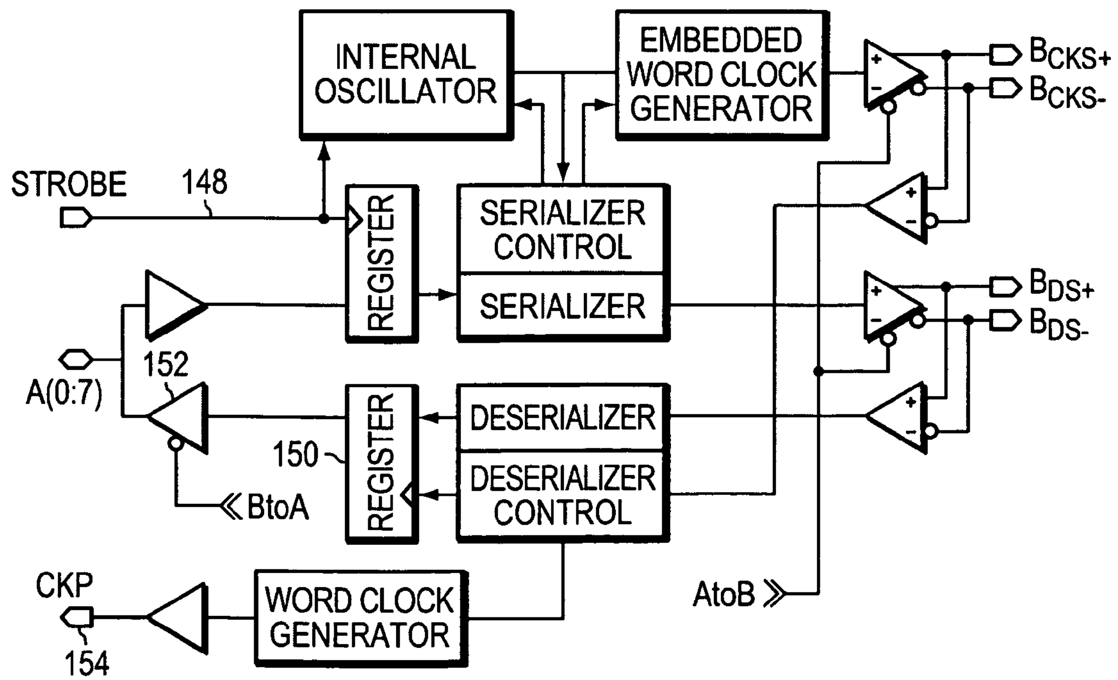

FIG. 10 is an inventive replacement for the prior art circuit of FIG. 6 where data is strobed into a register. The circuit functions in a manner very similar to that of FIG. 9. The primary difference is that there is a strobe signal 148 that loads the parallel data into a register for serializing. That strobe starts a gated clock or provides the synchronization signal to the free running pulse generation circuitry. In either case, the loaded parallel word is shifted out serially via the buffers BDS along with a bit clock BCKS. When a word is being received, the data is received via the input buffers from BDS lines along with a received BCKS signal. The BCKS signal is used to shift the data into the deserializer. The data is moved into a holding register 150. At about the same time, a signal CKP is generated and made available to the computing system to indicate that there is a word ready to input. In response thereto, the data is read by the computing system via the buffers 152 leading to the A[0:7] lines.

Operation of systems of FIGS. 9 and 10 show a single, differential bi-directional data and a single differential bi-directional clock line. However, single non-differential may be used in some applications. Use of a single clock transmission line may useful at lower system speeds, but at higher speeds, separate data in, data out, clock in and clock out lines may be used. In such a case, there are two data lines each transferring unidirectional data in opposite directions and separate unidirectional clock lines with clocks traveling in opposite directions. The serializer/deserializers may also be operated with two clock lines but a single bi-directional data line, or a single bi-directional clock line and two unidirectional data lines.

The buffer circuits of FIGS. 9 and 10 may be low voltage CMOS circuits with a nominal threshold of about ½ the powering voltage, VDD. The input buffers may be held off or three stated to conserve power when not active.

Similarly, the output buffers are three state circuits that will source/sink 2 mA's at 1.8V when active, and are held in the high −Z state when the device is not active.

CMOS devices with low, 2 mA, drive currents were used throughout embodiments of these circuits. However, TTL or LV_TTL or even differential signaling could be used and the drive current could be of any logic type, from very low currents (sub-mA's) to very high currents (100's of mA's). In three state configurations, a bus hold circuit, as known in the art, may be used.

FIGS. 9 and 10 illustrate two preferred embodiments of basic models for the following discussions.

Figure 11:
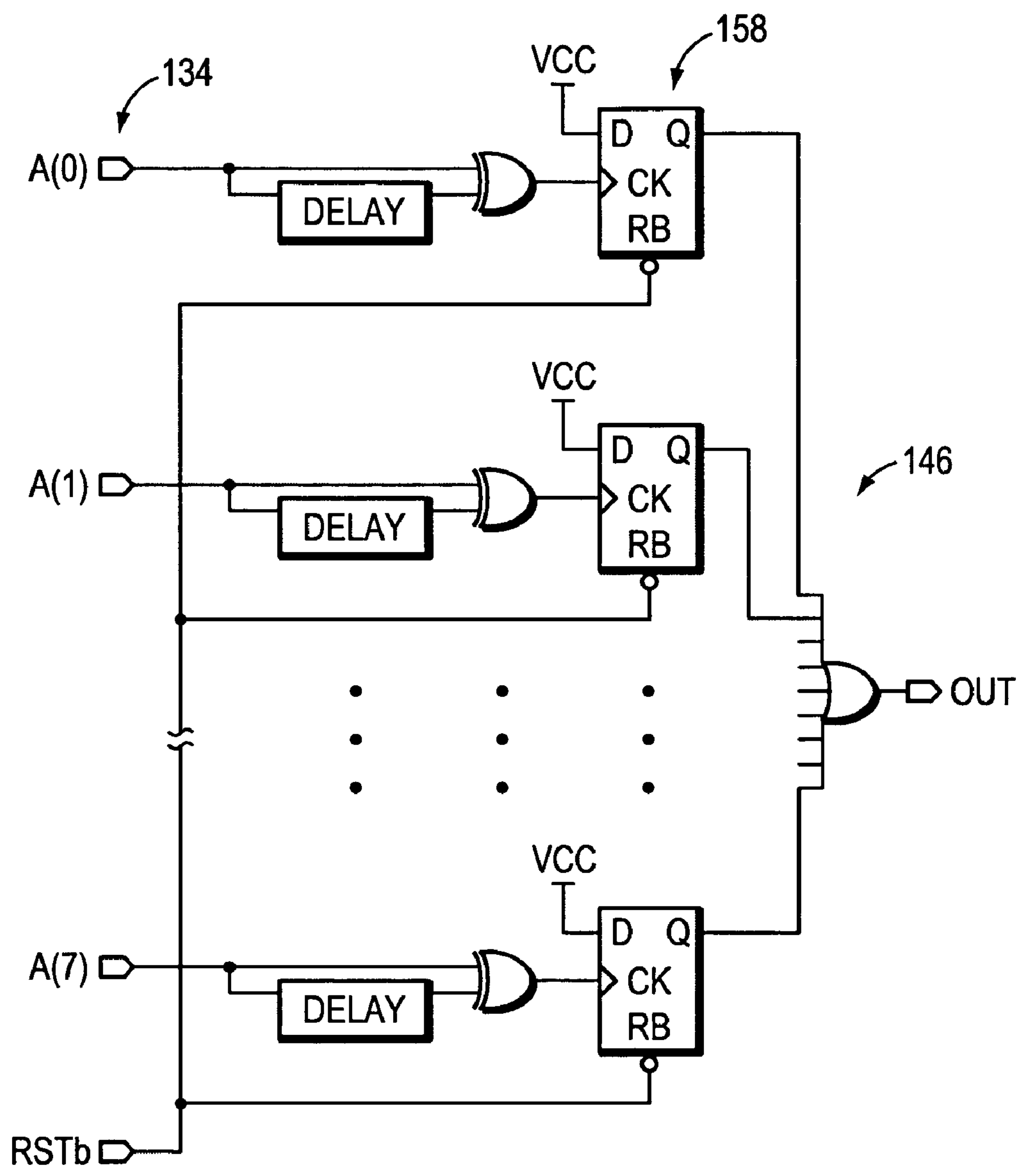
FIG. 11 is a schematic block diagram and timing diagram showing detection of a data bit change.
Figure 11:
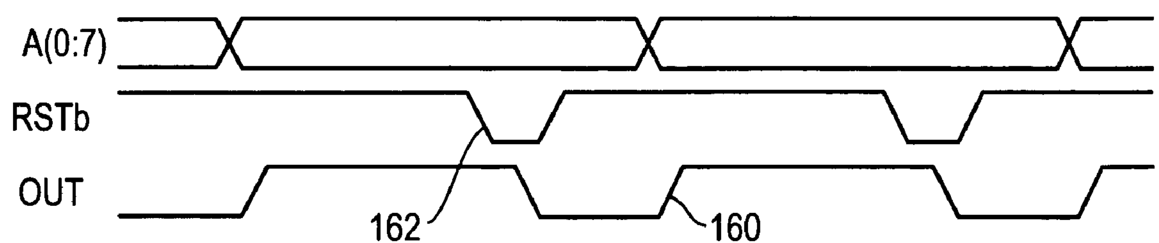

FIG. 11 shows an example of an edge detection scheme that may be used as item 146 in FIG. 9. Here, any (or all) transition on any of the data lines A[0:7] 134 will cause a clock pulse to occur at the clock inputs of the flops 158. Any change of state of the flop 158 will cause the OUT signal to go high 160. This OUT signal will be the EN gate signal 110 to the gated ring oscillator of FIG. 8A. After the data word is serialized, a RSTb 162 signal resets the edge detection oscillator 146. If no edge in the data lines occur, an edge may be derived from another signal generated from the sending system, e.g. an enable and/or a DIR signal that configures the circuit to send data in a given direction. The circuitry of FIG. 11 would change accordingly.

For FIG. 11, the data transitions must be substantially at the same time, but this would be true for most any system outputting parallel data.

In the above systems of FIGS. 9 and 10, the data lines (BDS+, BDS−) and the clock out lines (BCKS+, BCKS−) are typically differential pairs as shown, but may be single ended in other preferred embodiments. Line driver buffers 142 and 138 (FIG. 9) for differential pairs are well known in the art. These differential pairs will be referred to as CKS, and DS unless a specific reference is clearly referring to the individual signals. As mentioned above, typically there will be a deserializer packaged with the serializer 76.

Figure 12:
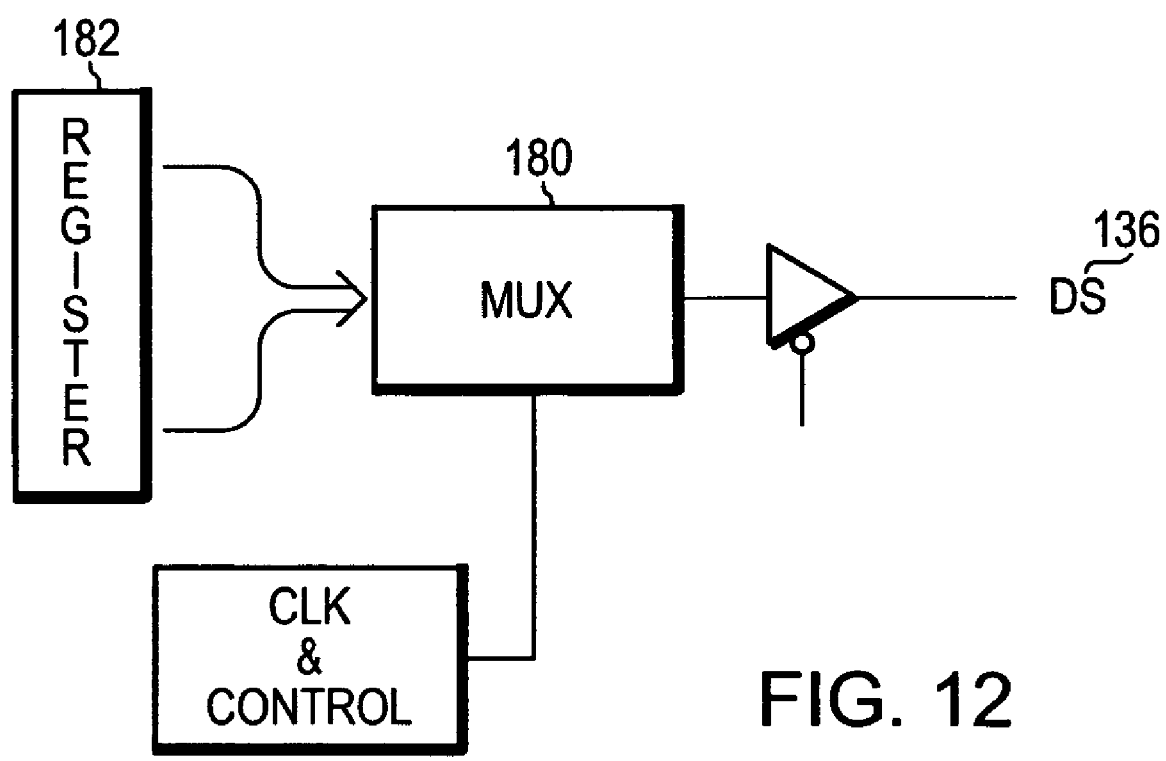
FIG. 12 is a block diagram of an alternative preferred embodiment.

In some preferred embodiments, the serializer is a shift register, but in others a multiplexer, FIG. 12, is used for selecting the different bits may be used. The data is held in a register 182 and is connected to the output DS via multiplexer (MUX) 180. Control circuitry for implementing the sequencing of the MUX are well known in the art.

FIGS. 13, 14, 15 and 16 show typical applications of the device illustrating a master/slave operation of two devices as shown in FIGS. 9 and 10.

Figure 13:
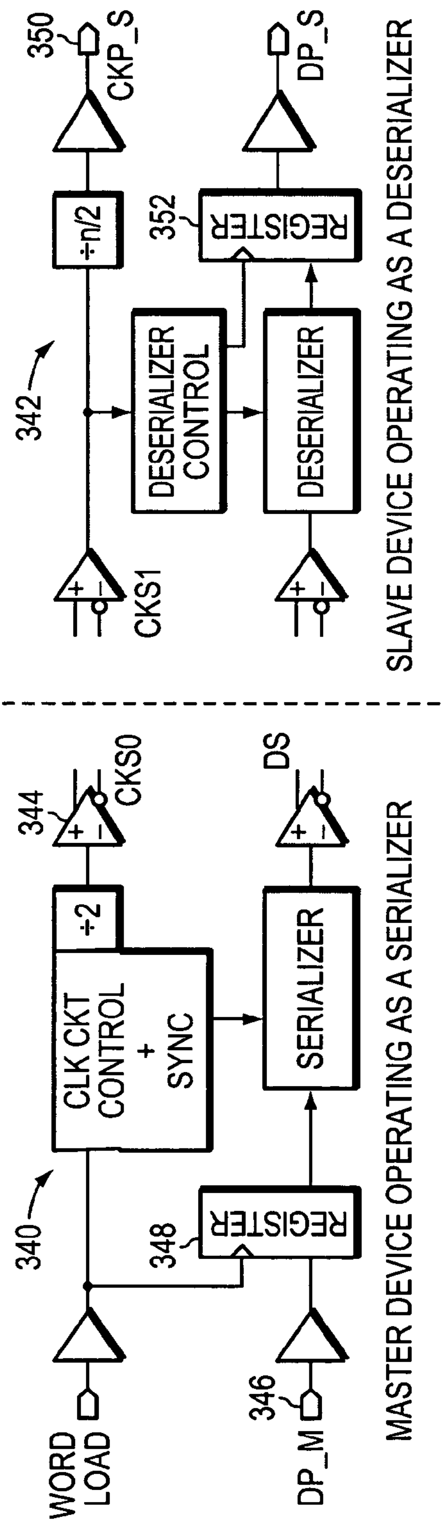
FIGS. 13, 14, 15, 16, are block diagram circuits showing some of the system arrangements using the present invention.

FIG. 13 illustrates a preferred serializer/deserializer pair operating as a master/slave with unidirectional data transfers. One device 340 is arranged in mode #1 with SER/DES signal set high, the device 340 acting as a serializer and master. Item 342 is the slave operating as a deserializer receiver of the data from 344. Device 342 is arranged with SER/DES signal set low. WORD LOAD is a word clock input, or a load signal, synchronized with the clock circuitry 340 that generates a bit clock 344 with an embedded word boundary. The bit clock is received by the slave 342 via the CKS1 port as shown. Register 348 receives parallel data 346 from a processor via DP_M port that is loaded into the register 348. That data is serialized and sent out synchronously with the bit clock CKSO via the DS line. The CKSO and the DS are arranged so that each edge of the CKSO is used to load data at the slave 342.

The slave 342 accepts the CKS1 and generates a word clock CK_P 350. The deserialized DS data stream is loaded into the register 352 and made available on the DP_S port together with the word clock CK_P so that the receiver processor can retrieve the sent data.

Figure 14:
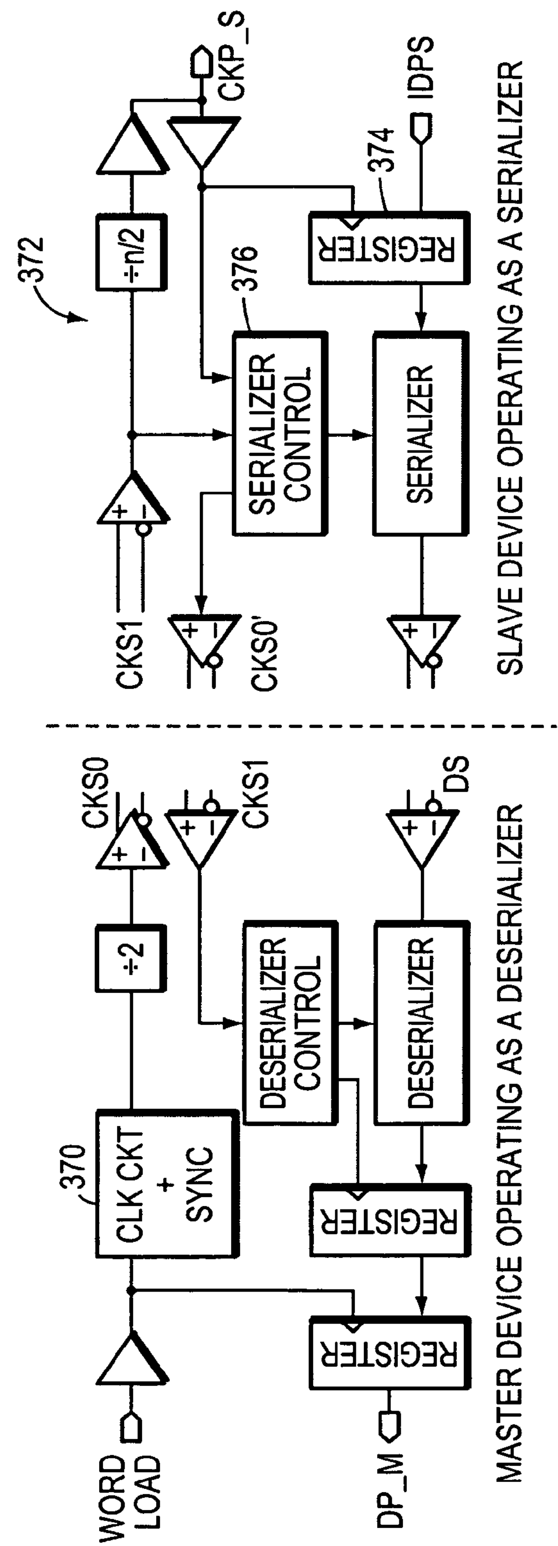

FIG. 14 illustrates a master/slave operation where the clock is generated at the master but data flows from the slave to the master. Device 370 is arranged as a master deserializer. Device 370 delivers a bit clock CKSO from a reference clock, WORD LOAD, or a load signal, and a divider, but with no word boundary. The master receives a bit clock CKS1 from the slave, but the slave has introduced the word boundary that was missing from in the clock CKSO signal. The serializer control 376 in the slave device 372 receives the CKSO and introduces the word boundary into the CKSO' sent back to the sending device 370. The serilizer control 374 also introduces the word boundary data bits into the sent bit stream DS. Device 370 receives the serial data DS, parallelizes it and presents the parallel data to the processor bus DP_M with the REFCK_M. The slave 372 serializes parallel data stored in the register 374 and sends the serialized data bits by the CKP_S clock.

Figure 15:
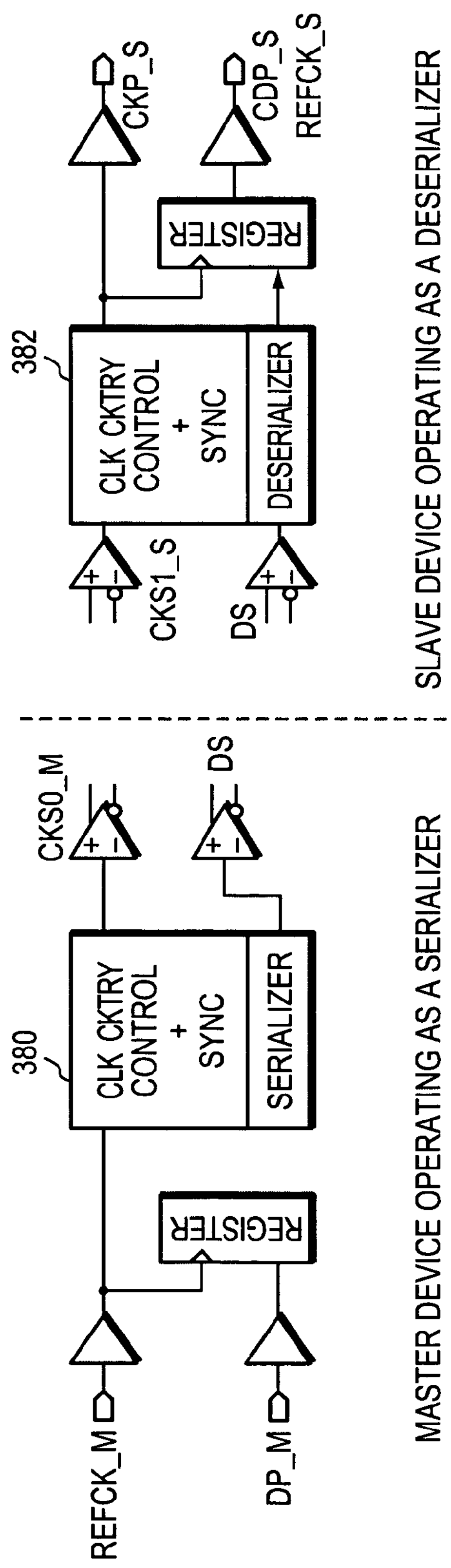
Figure 16:
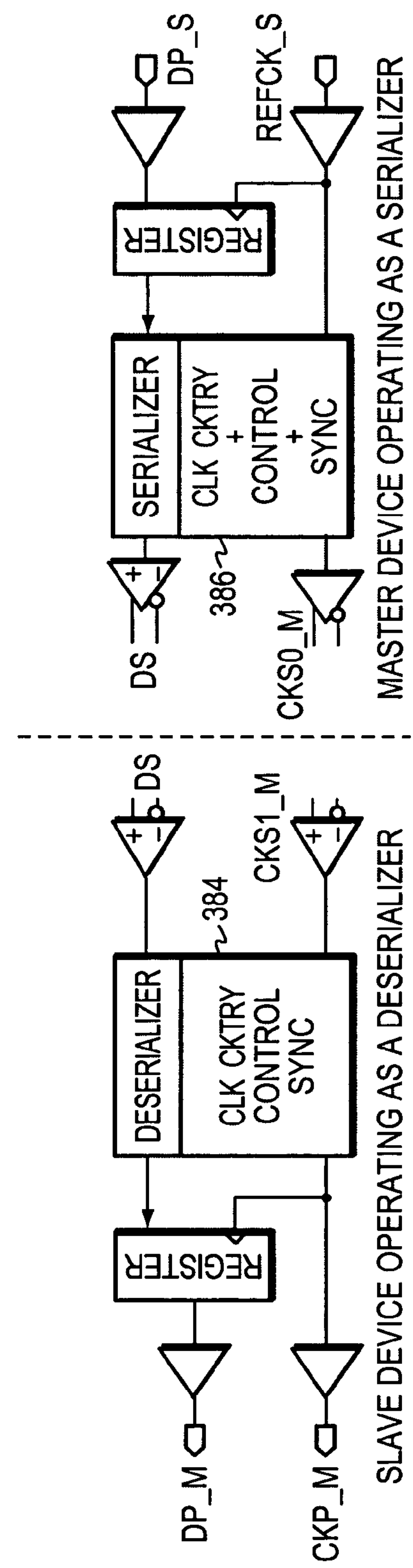

FIGS. 15 and 16 illustrate bidirectional data with clock circuitry and control running on both the master and slave device. The clocks running on either side of the serial transmission line are completely independent form each other. In each case, the master 380 in FIG. 15 and 384 in FIG. 16 each accepts the WORD LOAD signal and generates a bit clock with an embedded word boundary. Parallel data is received, as described above, and sent synchronously with the bit clocks to the slave devices. In this application, the master accepts from the slave a bit clock with an embedded word boundary and generates a word clock CKP_M. The slave devices 382 and 386 operate as slave deserializers and accept the bit clock with the embedded word boundaries. The slaves generate the word clock CKP_S(M) and de-serialize the data stream using the CKS1 clocks. Parallel data is written onto the DP_S port with the CKPS(M) clock. The slave also generates a synchronized bit clock based on the WORD LOAD signals and transmits this bit clock to the master.

Figure 17:
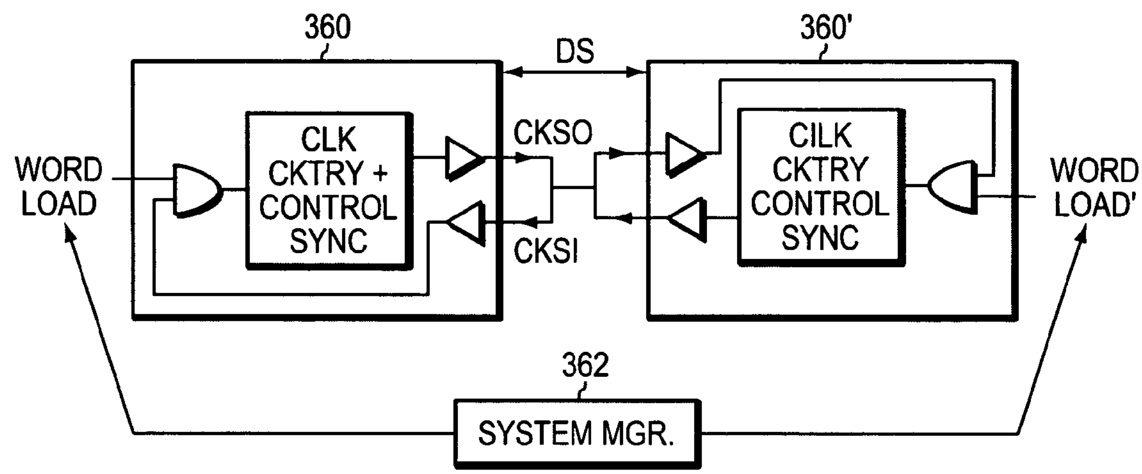
FIGS. 17 and 18 are system block diagrams showing control.

FIG. 17 shows an arrangement where there is a single data line and a single clock line between two devices 360 and 360' each similar to that in FIGS. 9 and 10. Here there is bidirectional data transfer where both data and clocks lines must be turned around to implement the bidirectional data transfers. The data transfers are half duplex and the modes and control of the items 360 and 360' must be arranged to accommodate the data reversal. The clock must be reversed and synchronized before data can be transferred. Control of 360 and 360' can be implemented as is known by system designers in this art field. For example, status lines 366 may be implemented or have an overall system manger 362 that controls both computing systems sending and receiving data to and from items 360 and 360' could implement the half duplex data transmission. For some applications this embodiment may be inappropriate principally due to turn around time and the dual use of the data and clock lines.

Control of turning around the data and clock lines may involve protocols and additional control or status lines between a sender (serializer) and a receiver (deserializer) that may also include a master aware of conditions or status at both ends of the data and clock lines. In some embodiments, the bit clock on the transmission lines may remain cycling but without any word boundary included. Alternatively, the bit clock may remain in a low where the protocol requires a word boundary to be a bit clock high together with a data line transition so that no word boundary can be detected. Logical combinations may be used as practitioners in the art will be aware. In situations where no data has been transferred in some time, when the bit clock is always being sent, the sending system will begin a data transfer by sending, for example, eight bits of data followed by the word boundary. The receiver will receive the serial data not knowing if it has received data or not, if no word boundary is detected the eight bits of data are deemed to be not useful. In this case the next bit is shifted into the receiver shift register and the earliest bit is shifted out and lost. This continues until a word boundary is detected at which time the receiver stores the prior eight bits as it is now deemed to constitute a word. Again, practitioners in the art will understand and be able to institute other techniques that are well known in the art.

Figure 18:
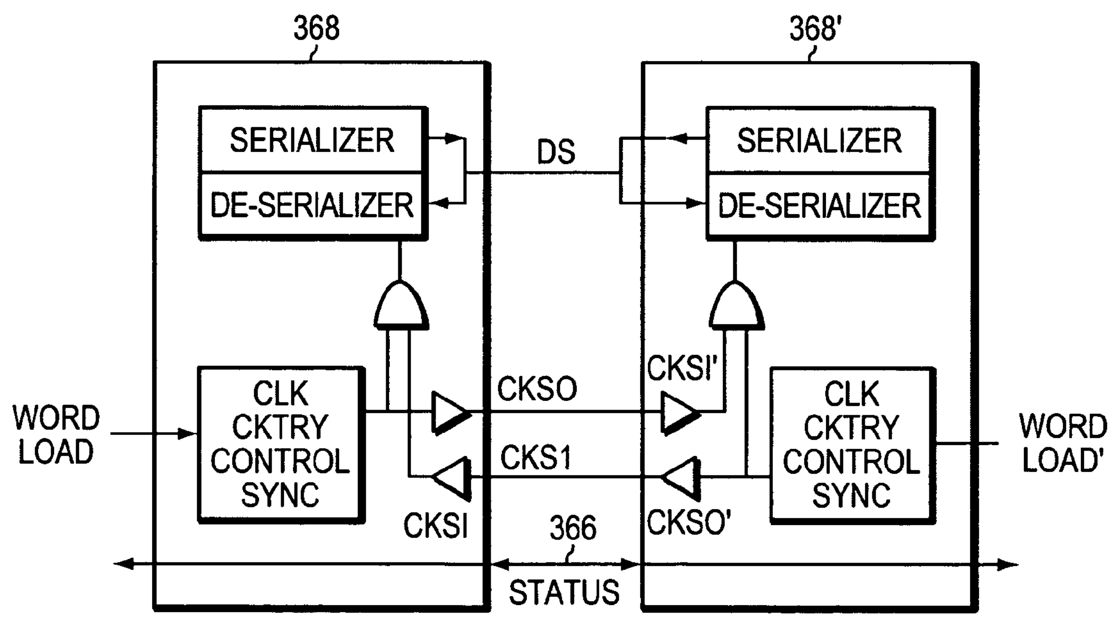

FIG. 18 is similar to FIG. 17 except that there are two separate clock lines between device 368 and 368.' This set up dispenses with clock turn around time and so can be used in applications that cannot use the system of FIG. 17. Both 368 and 368' are arranged for acceptance of parallel data from their respective processors and both are arranged to provide parallel data to those processors, as described earlier. In this implementation, when either 368 or 368' are acting as a de-serialzer, the transferred bit clock is used to directly load the deserializer as discussed above.

FIGS. 19, 20, and 21 diagrammatically show specific computing type systems employing the present invention. FIG. 19 shows a preferred embodiment of the present invention combined within a larger system. In this case the base processor 500 is transferring data to a camera 502, that may include a graphical processor 504. Here the motivation to serialize the data may be due to locations or form factors involved with the specific chips including pin out limitations. If due to pin out limitations, the serializer 506 may be packaged on the processor chip, but at the interface 510 it is evident that the serializing permits data interchange with many fewer physical lines than at the parallel interfaces at either the 500 chip or the 502 units. In this case, the base processor is receiving data bits from the camera, but in other preferred embodiments the data may be flowing from the base processor 500 to the camera 502 and back again.

FIG. 20 shows a preferred embodiment of a computer system 510 having a CPU and local memory. Here, say due to pinout reasons, the system 510 has on board a serializer/deserializer preferred embodiment of the present invention interchanging data with a remote memory system 512. The remote memory system includes a corresponding serializer/deserializer and, in this case, a mass memory.

FIG. 21 shows a preferred embodiment of virtually any generic digital system 514 sending and receiving serial data words with virtually any I/O device 516.

It should be understood that above-described embodiments are being presented herein as examples and that many variations and alternatives thereof are possible. Accordingly, the present invention should be viewed broadly as being defined only as set forth in the hereinafter appended claims.

What is claimed is:

1. A serializer for sending a data word out bit by bit, the serializer comprising:

a register for holding the data word, the register having at least one data output and a control input;

an output data port for serially outputting the data word bit by bit;

means for connecting the data output to the output data port;

a pulse generator free of external timing reference;

means for connecting the pulse generator to the control input after a data word has been loaded into the register, wherein the data word bits are serially output in response to to the pulse generator; and means for adding at least two boundary bits to the serially output data word bits, wherein the added two bits always include a logic one and a logic zero in any order, and further wherein the means for connecting the pulse generator to the control input includes means for holding the signal at the control input at a constant logic level during the outputting of the at least two added bits.

2. The serializer of claim 1 further comprising means for outputting a data word boundary for separating data words, the data word boundary comprised of a combination of pulse generator signals and the at least two signals added to the serially output data word bits.

3. The serializer of claim 1 wherein the register is a shift register.

4. The serializer of claim 1 further comprising a multiplexer arranged to select the at least one register output and connect it to the output data port.

5. The serializer of claim 1 further comprising means for loading the register from a parallel bus.

6. The serializer of claim 1 wherein the pulse generator signals, that define the serially output data word bits, provide a logic transition that defines when the data word bits being sent out are stable.

7. The serializer of claim 1 wherein the pulse generator runs at twice the data bit rate wherein the data bits are shifted out on one pulse edge and the following pulse edge defines when the data word bits being sent out are stable.

8. The serializer of claim 1 further comprising;

a load signal that loads the data word bits into the register; and a synchronizer that synchronizes the pulse generator to the load signal, so that the data word bits are stable in the register before they are output.

9. The serializer of claim 1 further comprising:

means for connecting the pulse generator output to one or more additional registers for holding additional data words; and wherein the additional data words are delivered to one or more additional output ports and serially output in response to the pulse generator, and further wherein signals from the pulse generator are output that define the output data word bits.

10. The serializer of claim 1 further comprising:

a load signal that loads the data word bits into the register; and means for enabling the pulse generator with the load signal, wherein the pulse generator provides a stream of pulses sufficient to output the data word after the data word bits are stable in the register.

11. The serializer of claim 1 further comprising:

means for detecting a change in the data word to be sent and in response thereto, causing the data word bits to be output via the output data port.

12. A deserializer arranged to receive a data word bit by bit, the deserializer comprising:

a serial input port for receiving the data word bit by bit;

a register for storing the data word bits, the register having a data input and a control input;

means for connecting the serial input port to the register data input;

a pulse generator receiving port for receiving pulses that defines the data word bits;

means for connecting the received pulses to the control input wherein the data word bits are serially received and stored in the register, and means for detecting at least two bits added to the data word bits, wherein the added two bits always include a logic one and a logic zero in any order, and further wherein the signals on the pulse generator receiving port stay at a constant logic level during the receipt of the at least two added bits.

13. The deserializer of claim 12 further comprising means for detecting a data word boundary that separates data words, the data word boundary comprised of a combination of signals on the pulse generator receiving port and the at least two bits added to the data word bits.

14. The deserializer of claim 12 wherein the register for storing data is a shift register.

15. The deserializer of claim 12 further comprising means for reading the register contents via a parallel port.

16. A serializer/deserializer for sending a data word out bit by bit and for receiving a data word bit by bit the serializer/deserializer comprising:

a first register for holding the data word, the first register having at least one data output and a first control input;

an output data port for serially outputting the data word bits by bit;

means for connecting the first register at least one data output to the output data port;

a pulse generator free of external timing reference;

means for connecting the pulse generator to the first control input after a data word has been loaded into the first register, wherein the data word bits are serially output in response to the pulse generator;

means for adding at least two boundary bits to the serially output data word bits, wherein the added at least two bits always include a logic one and the logic zero in any order, find further wherein the means for connecting the pulse generator to the first control input includes means for holding the signal at the control input at a constant logic level during the outputting of the at least two added bits;

a serial input port for receiving the data word bit by bit;

a second register for storing the data word bits, the second register having a data input and a control input;

means for connecting the serial input port to the second register data input;

a pulse generator receiving port for receiving pulses that defines the data word bits;

means for connecting the received pulses to the control input, wherein the data word bits are serially received and stored in the second register, and means for detecting at least two bits added to the data word bits, and further wherein the signals on the pulse generator receiving port stay at a constant logic level during the receipt of the at least two added bits.

17. The serializer/deserializer of claim 16 further comprising:

a means for detecting a change in the data contents of the first register, and in response thereto, causing the data word bits to be output via the output data port; and data outputs from the second register wherein the second register contents are available.

18. A process for serializing and sending a data word out bit by bit, the process comprising the steps of:

holding the data word in a the register having at least one data output and a control input;

connecting the data output to the output data port;

generating pulses free of external timing reference;

connecting the pulse generator to the control input after a data word has been loaded into the register, wherein the data word bits are serially output bit by bit;

outputting signals from the pulse generator to define the serially output data word bits, and adding two boundary bits to the serially output data word bits, wherein the added two bits always include a logic one and a logic zero in any order; and maintaining the pulse generator output at a constant logic level during the outputting of the two added bits.

19. The process of claim 18 wherein the register is a shift register and the step of outputting the data word bits includes shifting the data word bits out of the shift register.

20. The process of claim 18 wherein the step of outputting the data word bits includes demultiplexing the register outputs and connecting them to the output data port.

21. The process of claim 18 further comprising the step of loading the register from a parallel bus.

22. The process of claim 18 wherein the step of outputting signals from pulse generator includes the step of providing a logic transition that defines when the data word bits being sent out are stable.

23. The process of claim 18 further comprising the step of operating the pulse generator runs at twice the data bit rate wherein the data bits are shifted out on one pulse edge and the following pulse edge defines when the data word bits being sent out are stable.

24. The process of claim 18 further comprising the steps of:

loading the data word bits into the register; and synchronizing the pulse generator to the load signal, so that the data word bits are stable in the register before they are output.

25. The process of claim 18 wherein further comprising the steps of:

connecting the pulse generator output to one or more additional registers for holding additional data words; and wherein the additional data words are delivered to one or more additional output ports and serially output in response to the pulse generator, and further wherein signals from the pulse generator are output that define the output data word bits.

26. The process of claim 18 further comprising the steps of:

loading the data word bits into the register; and enabling the pulse generator with the load signal, wherein the pulse generator provides a stream of pulses sufficient to output the data word after the data word bits are stable in the register.

27. The process of claim 18 further comprising the steps of:

detecting a change in the data word to be sent, and in response thereto, causing the data word bits to be output via the output data port.

28. A process for receiving and deserializing a data word bit by bit, the process comprising the steps of:

receiving the data word bit by bit via a serial input port;

connecting the serial input port to the register data input;

storing the data word bits in a register having a data input and a control input;

receiving pulses that defines the data word bits;

connecting the received pulses to the control input, wherein the data word bits are serially received and stored in the register; and detecting two bits added to the data word bits, wherein the added two bits always include a logic one and a logic zero in any order; and detecting signals on the pulse generator receiving port that remain at a constant logic level during the receipt of the two added bits.

29. The process of claim 28 wherein the register for storing data is a shift register and the step of storing the data word includes shifting the data word bits into the shift register.

30. The process of claim 28 further comprising the step of reading the register contents via a parallel port.

31. A process for serializing and deserializing a data word sent out bit by bit and received bit by bit, the process comprising:

holding the data word in a first register having at least one data output and a control input;

connecting the data output to the output data port;

generating pulses free of external timing reference;

connecting the pulse generator to the control input after a data word has been loaded into the first register, wherein the data word bits are serially output bit by bit;

outputting signals from the pulse generator to define the serially output data word bits;

adding two boundary bits to the serially output data word bits, wherein the added two bits always include a logic one and a logic zero in any order;

maintaining the pulse generator output at a constant logic level during the outputting of the two added bits;

receiving the data word bit by bit via a serial input port;

connecting the serial input port to a second register data input;

storing the data word bits in the second register having a data input and a control input;

receiving pulses that defines the data word bits; and connecting the received pulses to the control input, wherein the data word bits are serially received and stored in the second register; and detecting at least two bits added to the data word bits and that the signal on the pulse generator receiving port stay at a constant logic level during the receipt of the at least two added bits.

32. The process of claim 31 further comprising the steps of:

detecting a change in the data word to be sent, and in response thereto, causing the data word bits to be output via the output data port; and reading the second register contents via a parallel port.

33. A computer system comprising:

a processor, memory, and an input/output apparatus, wherein the input/output apparatus comprises the serializer as defined in claim 1.

34. A computer system comprising:

a processor, memory, and an input/output apparatus, wherein the input/output apparatus comprises the deserializer as defined in claim 12.

35. A computer system comprising:

a processor, memory, and an input/output apparatus, wherein the input/output apparatus comprises the serializer/deserializer as defined in claim 16.

36. A digital camera system comprising an optical system and means for digitizing optical signals and a processor, memory, and an input/output apparatus arranged for process the digitized optical signals, wherein the input/output apparatus comprises the serializer as defined in claim 1.

37. A digital camera system comprising an optical system and means for digitizing optical signals and a processor, memory, and an input/output apparatus arranged for process the digitized optical signals, wherein the input/output apparatus comprises the deserializer as defined in claim 12.

38. A digital camera system comprising an optical system and means for digitizing optical signals and a processor, memory, and an input/output apparatus arranged for process the digitized optical signals, wherein the input/output apparatus comprises the serializer/deserializer as defined in claim 16.

39. A digital memory system comprising:

an input/output apparatus, wherein the input/output apparatus comprises the serializer as defined in claim 1.

40. A digital memory system comprising:

an input/output apparatus, wherein the input/output apparatus comprises the deserializer as defined in claim 12.

41. A digital memory system comprising:

an input/output apparatus, wherein the input/output apparatus comprises the serializer/deserializer as defined in claim 16.

42. A digital system having a parallel data bus comprising the serializer as defined in claim 1.

43. The digital system of claim 42 wherein the digital system is selected from the group consisting of a scanner, a keyboard, and a printer, and further comprising the serializer as defined in claim 1, or claim 10, or the serializer/deserializer defined in claim 16.

* * * * *